(12) United States Patent
Kocon

(10) Patent No.: US 6,717,230 B2
(45) Date of Patent: Apr. 6, 2004

(54) LATERAL DEVICE WITH IMPROVED CONDUCTIVITY AND BLOCKING CONTROL

(75) Inventor: Christopher B. Kocon, Plains, PA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 10/228,420

(22) Filed: Aug. 27, 2002

(65) Prior Publication Data

US 2003/0071320 A1 Apr. 17, 2003

Related U.S. Application Data

(63) Continuation-in-part of application No. 09/981,583, filed on Oct. 17, 2001.

(51) Int. Cl.$^7$ .............................................. H01L 23/58
(52) U.S. Cl. ..................... 257/487; 257/328; 257/330; 257/374; 257/491; 257/492
(58) Field of Search ................................ 257/328, 330, 257/374, 487, 491, 492

(56) References Cited

U.S. PATENT DOCUMENTS

| 5,323,040 | A | * | 6/1994 | Baliga ......................... 257/332 |
| 5,412,228 | A | * | 5/1995 | Baliga ......................... 257/133 |
| 5,488,236 | A | * | 1/1996 | Baliga et al. ................. 257/132 |
| 5,742,076 | A | * | 4/1998 | Sridevan et al. ............... 257/77 |
| 6,137,122 | A | * | 10/2000 | Liaw et al. .................... 257/132 |
| 6,194,741 | B1 | * | 2/2001 | Kinzer et al. ................... 257/77 |
| 6,452,228 | B1 | * | 9/2002 | Okuno et al. ................ 257/329 |

* cited by examiner

Primary Examiner—David Nelms
Assistant Examiner—Andy Huynh
(74) Attorney, Agent, or Firm—Thomas R. FitzGerald, Esq.

(57) ABSTRACT

An LDMOS device is made on a semiconductor substrate 112. It has an N+ source and drain regions 120, 132 are formed within a P well region 122. An interlevel dielectric layer 140 encapsulates biased charge control electrodes 142a and they control the electric field within the area of the drift region 14 between P-base 122 and the N drain region 132 to increase the reverse breakdown voltage of the device. This permits the user to more heavily dope the drift region and achieve a lower on resistance.

24 Claims, 7 Drawing Sheets

LATERAL DEVICE WITH IMPROVED CONDUCTIVITY AND BLOCKING CONTROL

This application is a continuation-in-part of U.S. patent application Ser. No. 09/981,583 filed Oct. 17, 2001.

FIELD OF THE INVENTION

This invention relates to semiconductor devices and, more particularly, to semiconductor power devices and methods for fabricating such devices.

BACKGROUND OF THE INVENTION

Power switching devices are devices of choice for handling large currents and large voltages. These devices, including bipolar transistors, field effect transistors, thyristors and diodes are used in a wide variety of power applications. Of these, devices which perform switching operations based on field effect principles are preferred when it is important to provide fast switching speeds and low current draw during switching operations.

In a conventional power MOSFET (Metal Oxide Semiconductor Field Effect Transistor) device it is desirable to minimize the on-resistance in order to reduce the power consumed while the device is in a conducting state. Although the resistance can, in principle, be reduced by increasing the dopant density in the various semiconductor layers, this may adversely affect device operation by, for example, allowing operation of parasitic devices, reducing forward blocking voltage or reducing the reverse bias breakdown voltage of the device.

In this regard, prior efforts to provide improved device performance have been of limited success. See, for example, U.S. Pat. No. 5,216,275 which discloses so called "super junction" devices. These comprise composite buffer layers formed with adjoining sublayers of semiconductor material having alternating conductivity types. Such structures, while in principle capable of providing significant improvement in performance, are of limited application due to inherent difficulties relating to control of dopant outdiffusion, particularly as the thickness of the sublayers decreases. The practical maximum electric field achievable in a super junction device is on the order of $2 \times 10^5$ V/cm and this limits the breakdown voltage of the device.

It is desirable to provide an improved semiconductor device that is not subject to such manufacturing limitations and which exhibits the combination of a higher breakdown voltage and a lower on-resistance. In U.S. Ser. No. 09/981, 583, incorporated herein by reference, I have taught the application of bias electrodes, also termed charge electrodes, to realize such a device. Summarily, my inclusion of bias electrodes enables modification of the electric field in significant conduction regions, e.g., drift regions, of a semiconductor device.

The embodiments disclosed in Ser. No. 09/981,583 are applicable to the wide variety of power devices and specific designs are provided therein. It is now recognized that, with the application of bias electrodes to lateral devices, additional improvements in designs and manufacturing techniques are desirable to further improve the performance and commercial value of these power products.

SUMMARY OF THE INVENTION

According to the invention, an embodiment of a lateral transistor device includes a lightly doped layer of semiconductor material having first and second more heavily doped regions of a first conductivity type formed along a surface. A third region of a second conductivity type is between the first and second regions and a lightly doped region of the first conductivity type is between the second and third regions. A control electrode is positioned to enable conduction through the third region and a biasing electrode structure is positioned along the third region to alter the electric field in the third region.

In another embodiment a lateral transistor device is formed with a lightly doped layer of semiconductor material having a first more heavily doped region of a first conductivity type formed therein. A second more heavily doped region of the first conductivity type is formed in an opening extending from a surface of the layer into the layer. A third region of a second conductivity type is between the first and second regions. In an associated method a lightly doped layer of semiconductor material is formed with a first more heavily doped region of a first conductivity type. An opening is provided, extending from a surface of the layer into the layer and a second more heavily doped region of the first conductivity type is formed in the opening. A third region of a second conductivity type is formed between the first and second regions.

Another method of forming a lateral transistor device includes forming a lightly doped layer of semiconductor material having first and second more heavily doped regions of a first conductivity type formed along a surface and providing a third region of a second conductivity type between the first and second regions. A lightly doped region of the first conductivity type is formed between the second and third regions and a control electrode is positioned to enable conduction through the third region. A biasing electrode structure is positioned along the third region to alter the electric field in the third region. According to one embodiment of the invention the biasing electrode structure is positioned in a trench along the third region to control the electric field intensity in the third region.

A method of operating a lateral transistor device is also provided. Current is initiated through at least one of the device semiconductor junctions. Bias electrodes are operated to control field intensity in a drift region of the device during current conduction. In one embodiment the conduction is initiated in accord with field effect principles.

BRIEF DESCRIPTION OF DRAWINGS

The invention will be more fully understood when the following detailed description is read in conjunction with the drawings wherein.

Figure 1:
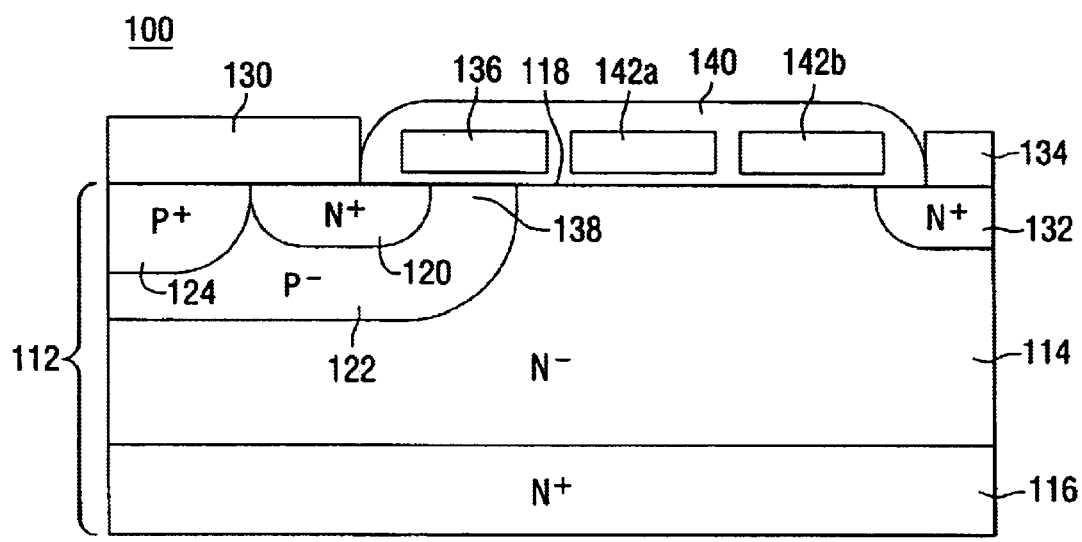
FIG. 1 illustrates in cross section a lateral MOSFET device according to another embodiment of the invention.

In accord with common practice the various illustrated features in the drawings are not to scale, but are drawn to emphasize specific features relevant to the invention. Moreover, the sizes of features and the thicknesses of layers may depart substantially from the scale with which these are shown. Reference characters denote like elements throughout the figures and the text.

DETAILED DESCRIPTION OF THE INVENTION

Example embodiments of the invention are now provided. While these illustrate application of concepts to silicon-based power devices, it is intended that the principles disclosed herein will apply to a wide variety of semiconductor devices, including those formed with compound semiconductor materials, e.g., silicon carbide, as well as integrated circuits. Although examples of devices reference specific conductivity types, and incorporation of specific materials, e.g., dielectrics and conductors, these are only exemplary and it is not intended that the invention be limited to embodiments that incorporate such conventional components or methodologies.

With charge control electrodes, one can increase the doping the drift region to lower the on-resistance. With the invention, the resistance can be reduced, the reverse breakdown voltage is increased.

FIG. 1 shows a lateral MOSFET device 100 according to the invention. The lateral MOSFET 100 includes a semiconductor substrate 112 with an N– drift region 114 and an N+ region 116. Along a major surface 118 of the substrate 112 an N+ source region 120 is formed within a P– well region 122 and a P+ body region 124 is formed adjacent the source region 120 within the well region 122. An N+ drain region 132 is separated from the P– well region 122 by the drift region 114. A source metal contact 130 and a drain metal contact 134 are respectively coupled to the N+ source region 120 and the N+ drain region 132.

A planar gate electrode 136 is positioned over the portion of the P-well region between the N+ source region 120 and the N+ drain region 132 to control a conduction channel 138 therein. Bias electrodes 142a and 142b are formed over the major surface 118 between the channel 138 and the drain region 132. The bias electrodes 142a and 142b and the planar gate electrode 136 are within dielectric layer 140. Biasing elements (not shown) may be used to bias the electrodes 142a and 142b at different voltages.

Figure 2:
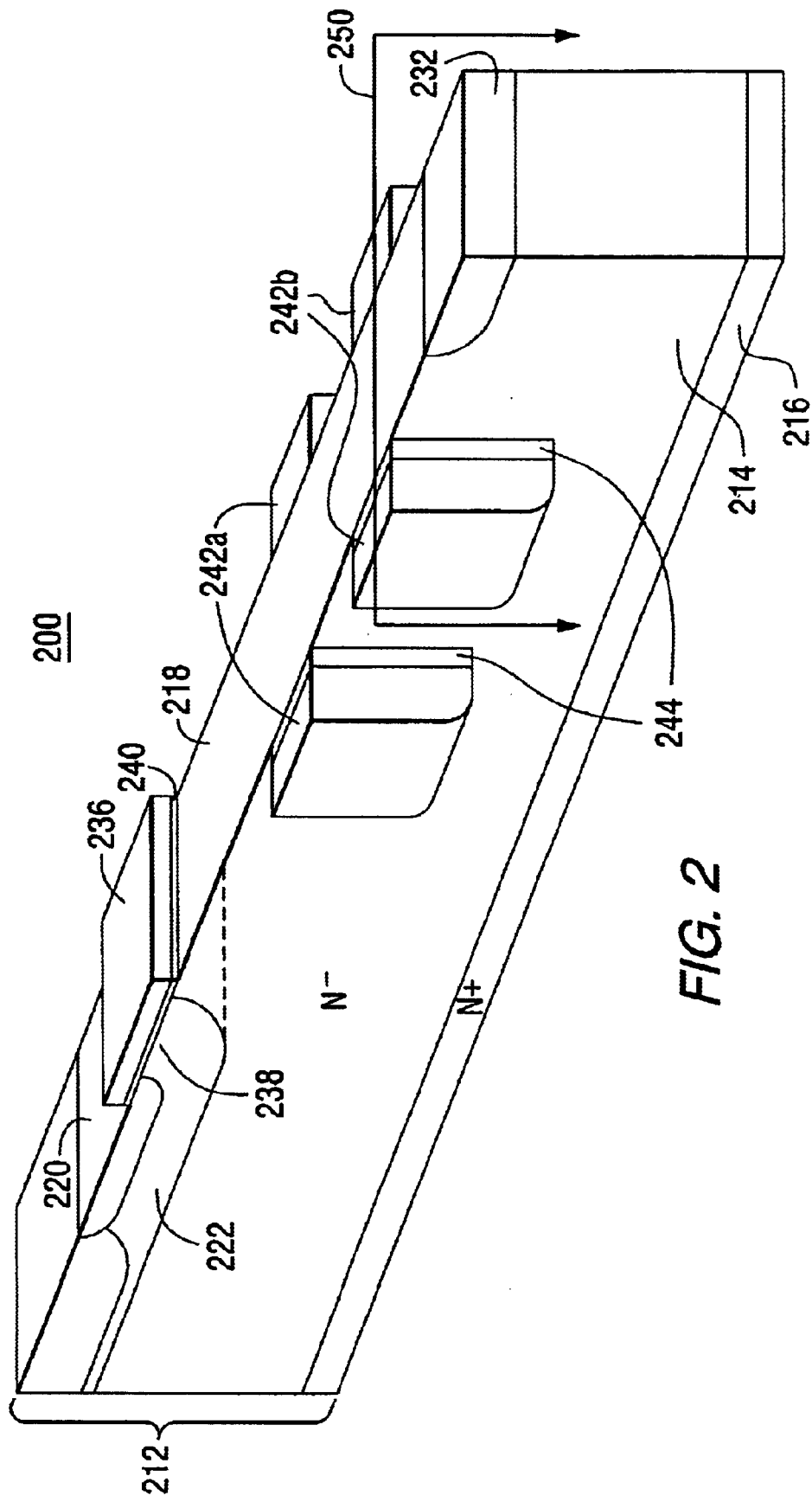
FIG. 2 is a partial perspective view of another MOSFET device according to the invention.

In other embodiments of the invention the charge control electrodes may be formed within the drift region of a transistor device. Preferably, they are isolated from the drift region by dielectric material. By way of example, the partial perspective view of FIG. 2 illustrates a lateral MOSFET device 200 having a pair of bias electrodes formed about the drift region of the device. Because provision of such bias electrodes in a lateral bipolar device will be readily understood from the FIG. 3 example of a MOSFET device, the corresponding embodiment will be readily understood without further illustration.

The lateral MOSFET 200 includes a semiconductor substrate 212 with an N–drift region 214 formed over an N+ region 216. Along a major surface 218 of the substrate 212 an N+ source region 220 is formed within a P– well region 222 and an N+ drain region 232 is separated from the P well region 222 by the drift region 214. The source and drain contacts as well as other conventional are not shown in order to more clearly illustrate details more relevant to the invention.

A gate electrode 236 is positioned over the portion of the P well region between the N+ source region 220 and the N+ drain region 232 to control a conduction channel 238 therein. The gate electrode 236 is electrically isolated from the channel 238 by a thermally grown oxide 240.

Pairs 242a and 242b of bias electrodes are formed along the drift region 214 with each member of a pair on an opposing side of the drift region. The bias electrodes 242a and 242b are each spaced from the drift region by dielectric material 244.

Figure 3:
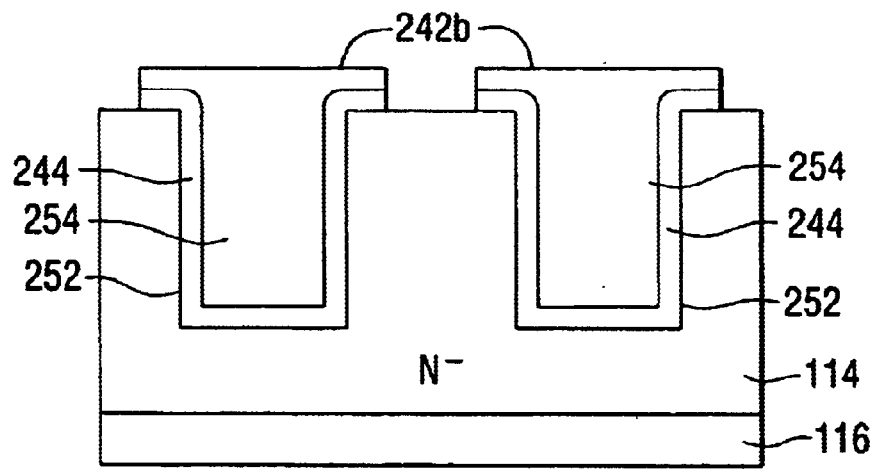
FIG. 3 provides a cross sectional view of the device illustrated in FIG. 2.

FIG. 3 provides a cross-sectional view of the device 200 taken along the cut line 250 to illustrate an exemplary pair 242b of bias electrodes formed about the drift region 214. The structure includes a pair of trenches 252 each lined with the dielectric layer 244 and an electrode 254 formed therein. As illustrated in the figure each electrode 254 may extend out of its respective trench 252 to effect electrical contact thereto. By way of example and not limitation, the electrodes 254 could be formed of metal such as Al or of polysilicon.

Figure 4A:
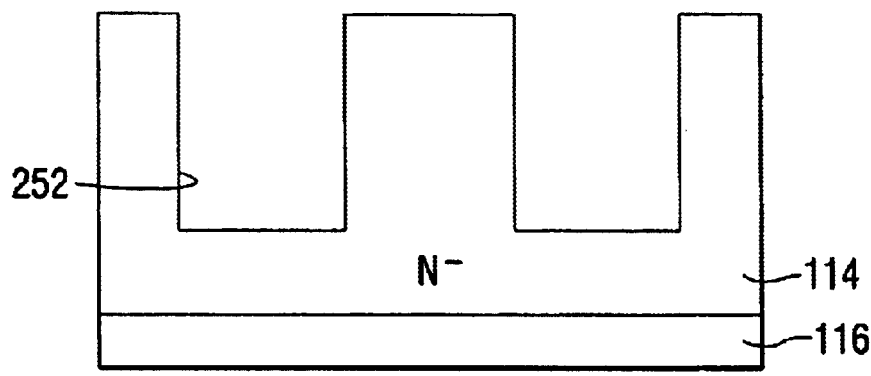
FIGS. 4A and 4B illustrate select fabrication steps for devices according to the invention.
Figure 4B:
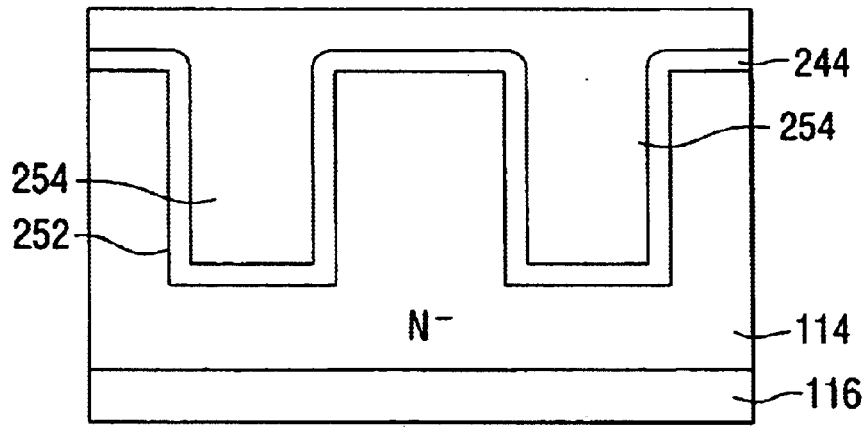

An exemplary sequential process for fabricating pairs 242a and 242b of bias electrodes is illustrated in the partial cross-sectional view of FIGS. 4A, 4B, again taken along the cut line 250 of FIG. 2. After formation of the N– drift region 114 and the N+ region 116, the trenches 252 are formed with a conventional photoresist pattern and anisotropic etch sequence about the drift region 114 as shown in FIG. 4A. Next, the dielectric material 244, which may be thermally grown silicon dioxide formed simultaneously with the gate dielectric layer 240, or may be deposited dielectric, e.g., a silicon oxide or silicon nitride, is formed in the trenches 252 as well as along the major surface 218. Aluminum may then be sputtered to fill the balance of the trenches 252, as shown in FIG. 4B, after which the surface 218 is patterned and masked to remove unwanted material, this resulting in the structure shown in FIG. 3. Alternately, after the trenches are lined with the dielectric material 244 the trenches may be filled with heavily doped polysilicon, in lieu of a metal deposition, followed by removal of unwanted material from the surface 218.

Figure 5:
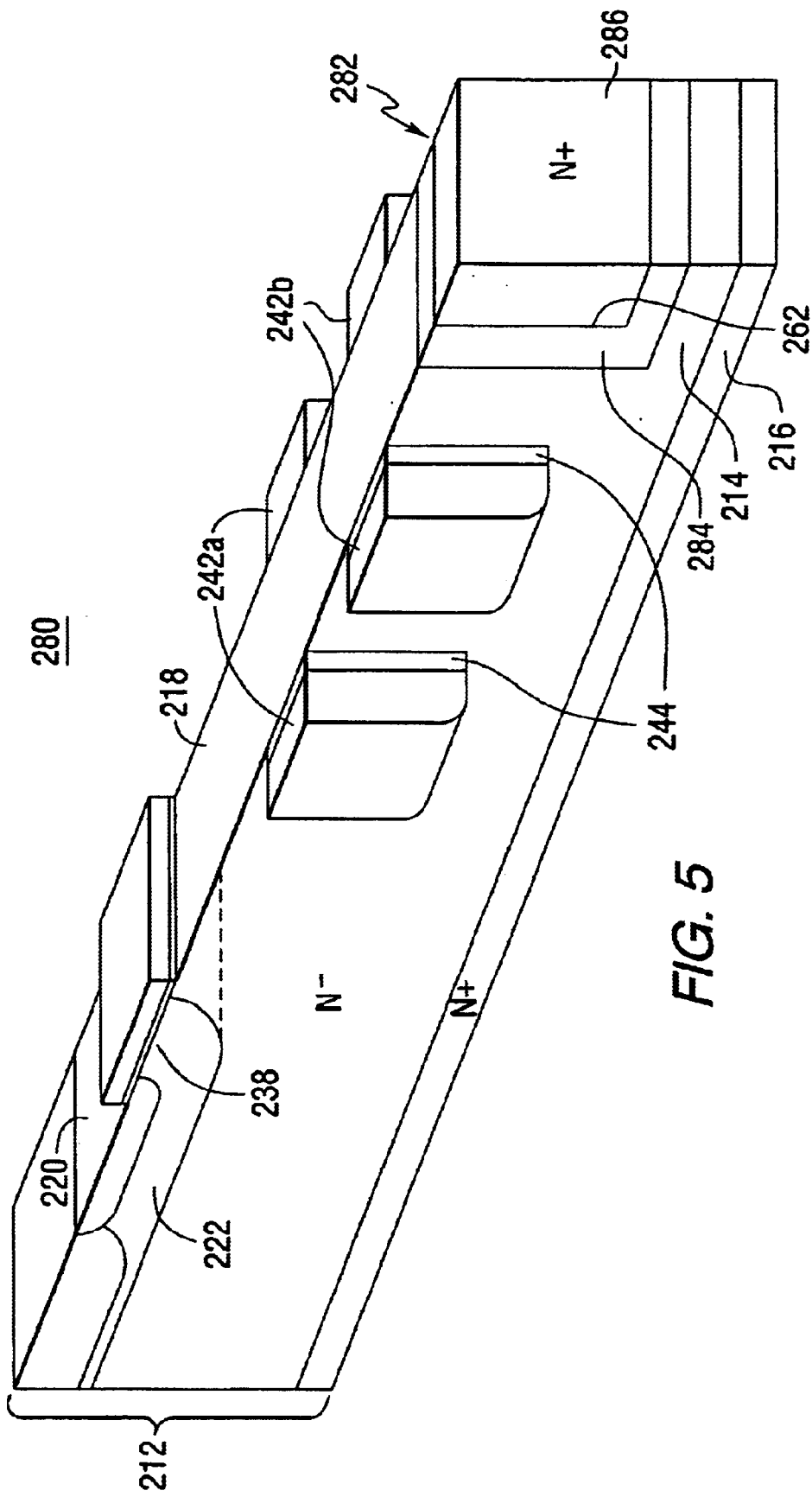
FIG. 5 illustrates in a partial perspective view still another MOSFET device according to the invention.

FIG. 5 illustrates another lateral MOSFET device 280 according to the invention wherein reference numerals used in FIG. 2 denote like features in FIG. 5. The drain region 282 (corresponding to the drain 232 of FIG. 2) is formed about a trench 262 extending from the surface 218 into the substrate 212 to provide a deep drain 284 and facilitate a wider current conduction path through the drift region 214. That is, both, the pairs 242a and 242b of bias electrodes and the drain region 282, extend substantially into the substrate 212, to improve the overall usage and efficiency of the substrate. The wider conduction path is characterized by a lower resistivity during conduction, enabling higher current density, with greater control over breakdown voltage.

Figure 6A:
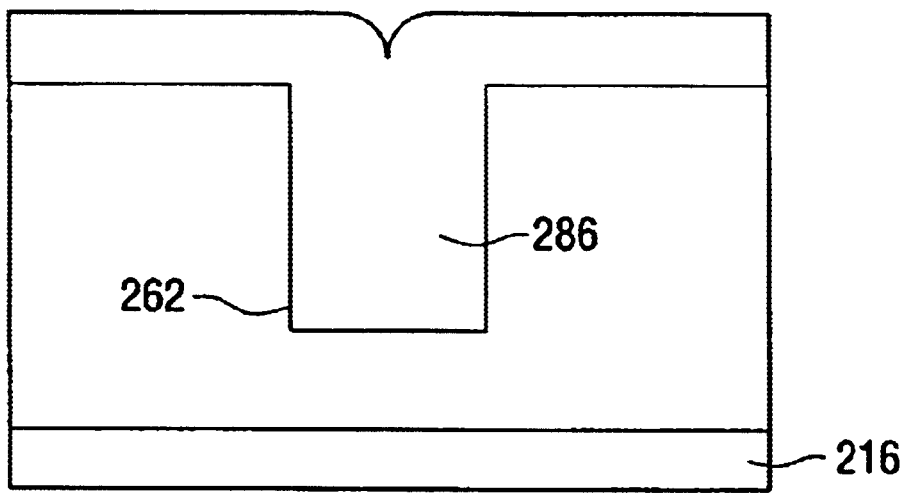
FIGS. 6A and 6B illustrate select details relating to fabrication of the FIG. 6 device.

The drain region 282 comprises the trench 262 filled with heavily doped N+ polysilicon 286 which is allowed to outdiffuse N+ dopant into the trench wall portions to create the N+ deep drain 284 surrounding the trench 262. The cross sectional views of FIGS. 7A and 7B, illustrate formation of the trenched drain region 282. These views are taken along a plane orthogonal to the direction of current flow through the drift region 214 of the device 280. The trench 262, as shown in FIG. 6A, may be formed in the same photoresist pattern and anisotropic etch sequence used to form the pairs 242A and 242B of bias electrodes as illustrated in FIG. 4A. If a thermal oxide is grown in the trenches 252, the trench 262 may be masked off to prevent oxide formation therein.

Alternately, if oxide is formed in the trench 262 it can be selectively removed after formation of the gate oxide 240.

Figure 6B:
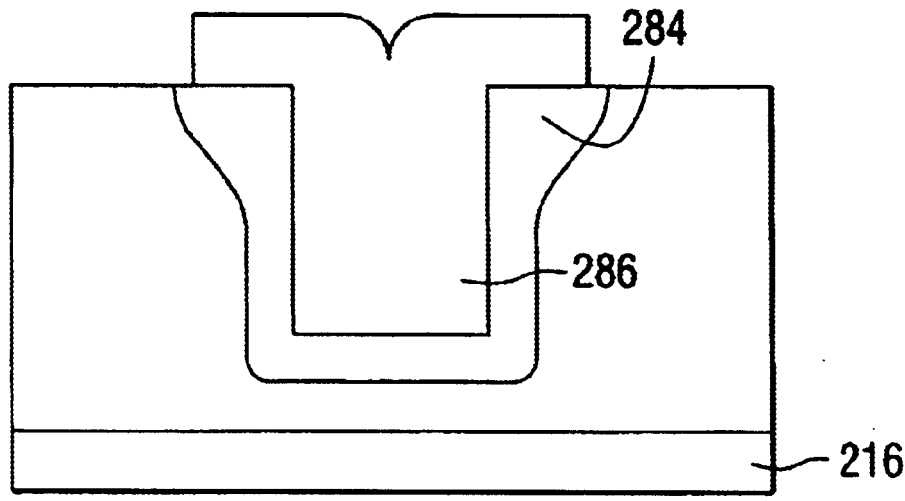

Doped polysilicon 286 is deposited over the surface 218 to fill the trench 262, preferably simultaneously with the formation of the gate electrode 236 and the bias electrodes 242a and 242b. Referring next to FIG. 6B, after these formations are patterned and etched the dopant in the polysilicon 286 is outdiffused as shown by arrows to form the deep drain 284.

Figure 7:
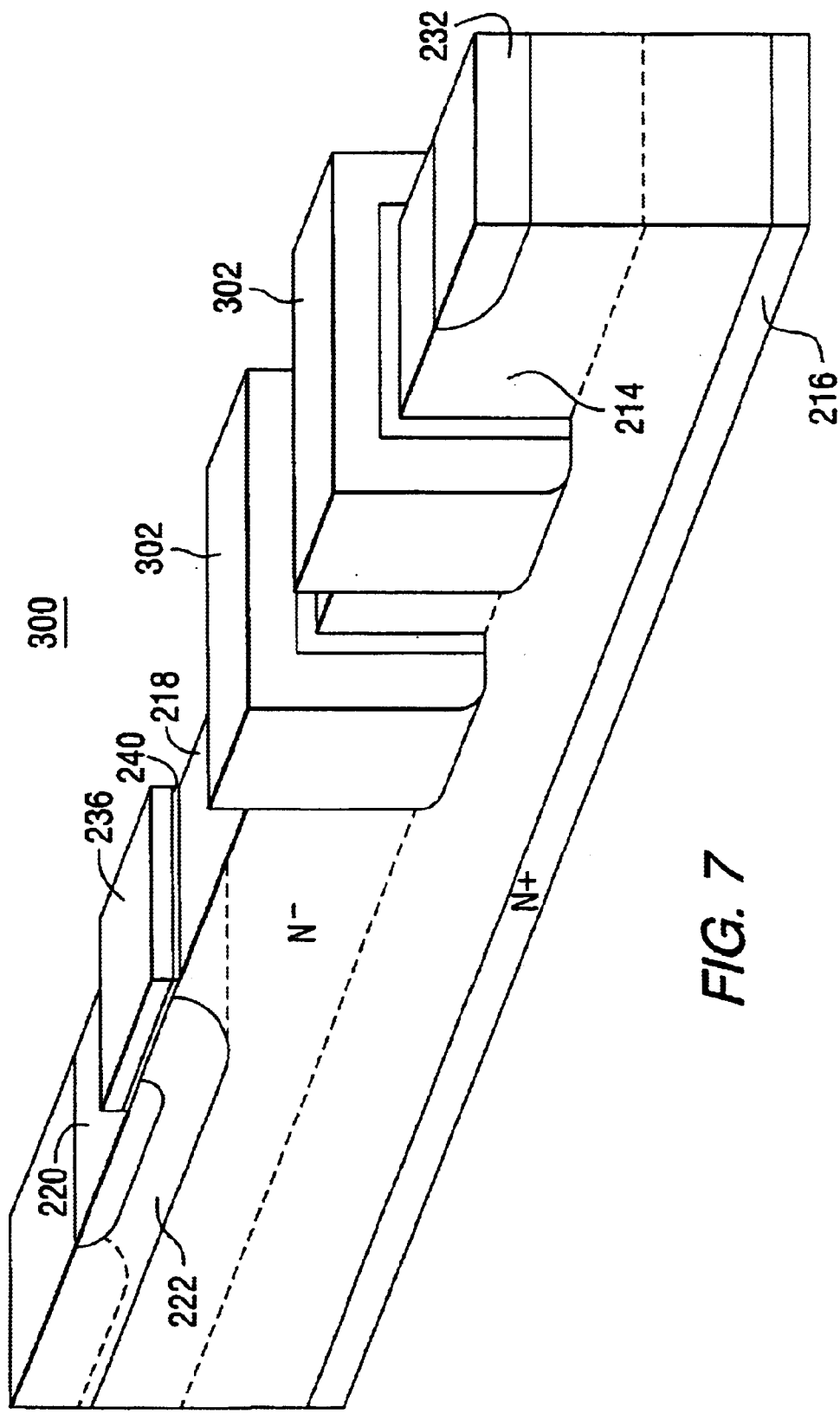
FIG. 7 illustrates still another MOSFET device according to the invention.

FIG. 7 illustrates another lateral MOSFET device 300 according to the invention wherein reference numerals used in FIGS. 2–5 denote like features in FIG. 7. In the device 300 the bias electrodes 302 (corresponding to the pairs 242a and 242b) are configured in a U-shaped formation about the drain region 214. This configuration can result from the process sequence of FIG. 5 by patterning and etching the polysilicon layer of FIG. 5B to bridge the individual elements in each of the trenches 252.

Figure 8A:
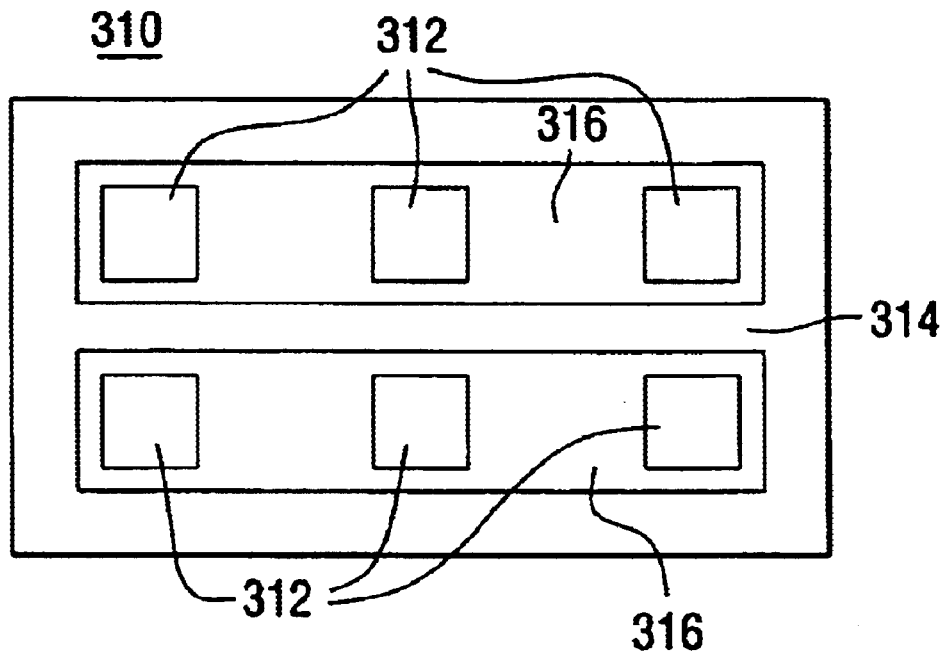
FIGS. 8A and 8B provide plan views of generic devices incorporating features of the invention to illustrate alternate configurations.
Figure 8B:
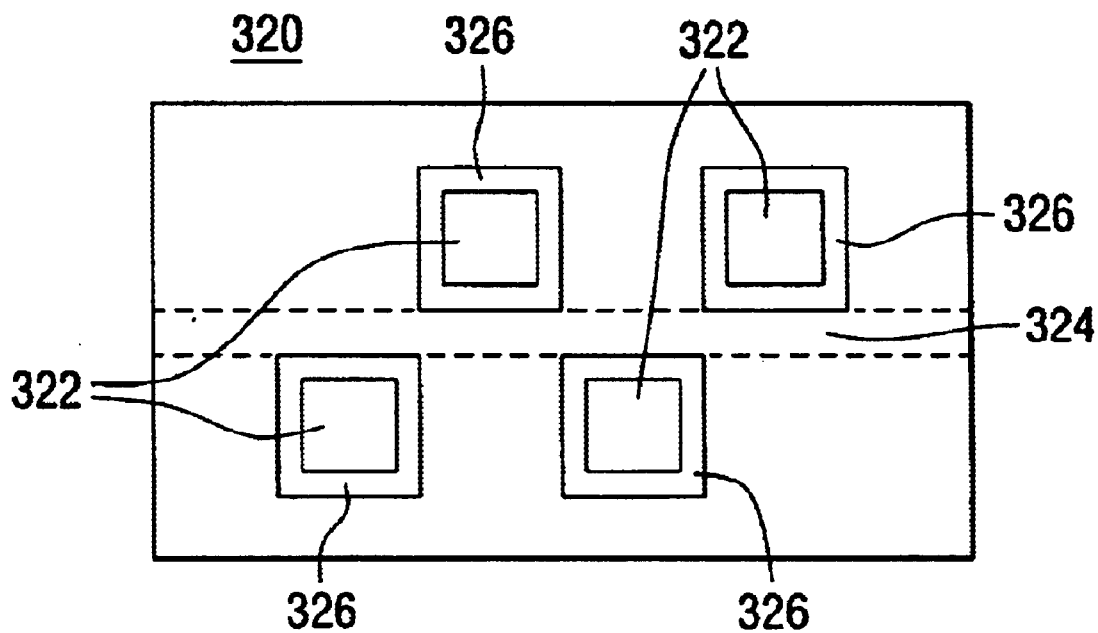

FIGS. 8A–8B provide plan views of devices according to the invention to illustrate that the concepts disclosed herein may be applied in a variety of embodiments. In FIG. 8A a transistor device 310 has bias electrodes 312 on each side of the drift region 314 formed in the same trench with a continuous layer 316 of dielectric isolating multiple pairs of bias electrodes in each trench from the drift region 314. In the embodiment of FIG. 8B a transistor device 320 includes pairs 322 of individual bias electrodes on each side of the drift region 324 formed in different trenches each lined with a dielectric layer 326 to isolate a bias electrode from the drift region 324. Individual ones of each pair 322 of the electrodes, i.e., on opposing sides of the drift region 324, are staggered with respect to one another.

While specific features have been illustrated in order to describe application of the inventive concepts, other features not described in detail will be readily understood. For example, the charge control electrodes shown among the figures can be biased with a variety of different voltages derived from several possible sources including, for example, voltages applied to the various terminals of the associated devices in order to modify the field uniformity in a drift region as desired. For example, those skilled in the art will understand that the doping of regions 214 and 314 can be varied to be less at the bottom of the regions than at the top. This avoids high fields. This result can be accomplished with graded epitaxial layers of with conventional doping and diffusion.

Generally, improved field uniformity is achievable based on selection and configuration of an appropriate number of bias electrodes. Specific improvements will depend on parameters including device operating characteristics, thickness of insulator layers positioned to isolate the bias electrodes and voltages applied to the various electrodes. These improvements can be understood with specificity according to well known field principles. For example, while the field intensity will be a function of distances between various potentials, the actual intensity will depend on practical embodiments relating to shapes and sizes of the electrodes that act as field plates.

Accordingly, the foregoing illustrations are only exemplary while many other embodiments will be apparent without departing from the scope of this invention which is only limited by the claims which now follow.

I claim:

1. A lateral transistor device comprising:
   a lightly doped layer of semiconductor material having first and second more heavily doped regions of a first conductivity type formed along a surface thereof;
   a third region of a second conductivity type between the first and second regions;
   a lightly doped region of the first conductivity type between the second and third regions;
   a control electrode positioned to enable conduction through the third region; and
   a biasing electrode structure positioned along the third region to alter the electric field in the third region.

2. The device of claim 1 wherein the biasing electrode structure is formed in a trench along the third region.

3. The device of claim 1 wherein the biasing electrode structure comprises a plurality of electrodes along the third region.

4. The device of claim 1 wherein the biasing electrode structure comprises a plurality of field control electrodes along the third region, each configured to apply a voltage with respect to a different portion of the third region.

5. The device of claim 4 wherein each field control electrode is capable of applying a different bias voltage with respect to the third region.

6. The device of claim 1 configured as a field effect transistor wherein the first region comprises a source, the second comprises a drain and the third region comprises a channel region.

7. The device of claim 1 wherein the third region comprises a field effect channel region and the lightly doped region of the first conductivity type comprises a drift region.

8. The device of claim 1 wherein the biasing electrode structure comprises multiple electrodes extending into the layer from the surface.

9. The device of claim 1 wherein the biasing electrode structure comprises an electrode extending over the lightly doped region and into the layer on opposing sides of the lightly doped region in a U-shape formation.

10. The device of claim 1 wherein the lightly doped region of the first conductivity type extends into the layer from the surface and the biasing electrode structure comprises one or more electrodes also extending into the layer from the surface.

11. The device of claim 1 wherein the second more heavily doped region is formed in a trench extending from the surface into the layer.

12. The device of claim 1 wherein the biasing electrode structure is electrically isolated from the lightly doped region of the first conductivity type.

13. A lateral transistor device with enhanced breakdown voltage, comprising:
   a lightly doped layer of semiconductor material having more heavily doped source and drain regions of a first conductivity type formed therein;
   a channel region of a second conductivity type adjacent the source region and between the source and drain regions;
   a drift region of the lightly doped semiconductor material disposed between the channel and the drain regions;
   a control electrode disposed over the channel region for controlling the flow of current between the source and drain regions; and
   bias electrodes disposed adjacent the drift region to alter the electric field in the drift region to increase reverse breakdown voltage.

14. The device of claim 13 wherein the biasing electrodes comprises multiple electrodes extending into the layer from the surface.

15. The device of claim 14 wherein the biasing electrodes comprises pairs of electrodes spaced apart from each other on opposite sides of the drift region.

16. The device of claim 15 wherein each one of the pairs of the biasing electrodes are opposite one another.

17. The device of claim 14 wherein the electrodes are spaced on opposite sides of the drift region and are offset with respect to the electrodes on opposite sides of the drift region.

18. The device of claim 13 wherein the electrodes are enclosed in a dielectric material.

19. The device of claim 18 wherein each bias electrode is enclosed in its own dielectric material.

20. The device of claim 18 wherein bias electrodes on opposite sides of the drift region are enclosed in a common dielectric material.

21. The device of claim 18 wherein pairs of bias electrodes on opposite side of the drift region are enclosed in a common dielectric.

22. The device of claim 13 wherein electrodes enclose the drift region.

23. The device of claim 22 wherein the bias electrodes enclose the drift region of three sides.

24. The device of claim 13 wherein the biasing electrode structure comprises an electrode extending over the lightly doped region and into the layer on opposing sides of the lightly doped region in a U-shape formation.

* * * * *